United States Patent
Hayano

[11] Patent Number: 5,751,051
[45] Date of Patent: May 12, 1998

[54] SEMICONDUCTOR DEVICE EQUIPPED WITH ELECTROSTATIC BREAKDOWN PROTECTION CIRCUIT

[75] Inventor: Kiminori Hayano, Tokyo, Japan

[73] Assignee: NEC Corporation, Japan

[21] Appl. No.: 951,412

[22] Filed: Oct. 16, 1997

Related U.S. Application Data

[63] Continuation of Ser. No. 680,291, Jul. 12, 1996, abandoned.

[30] Foreign Application Priority Data

Jul. 18, 1995 [JP] Japan .................. 7-181348

[51] Int. Cl.[6] .................. H01L 29/00; H02H 9/00
[52] U.S. Cl. .................. 257/546; 257/173; 257/355; 361/56; 361/57; 361/91; 361/98; 361/100
[58] Field of Search .................. 257/546, 173, 257/355; 361/56, 57, 91, 98, 100

[56] References Cited

U.S. PATENT DOCUMENTS

| | | | |
|---|---|---|---|
| 5,182,621 | 1/1993 | Hinooka | 257/546 |
| 5,220,443 | 6/1993 | Noguchi | 359/59 |
| 5,272,586 | 12/1993 | Yen | 361/111 |
| 5,442,217 | 8/1995 | Mimoto | 257/361 |
| 5,521,783 | 5/1996 | Wolfe et al. | 361/56 |
| 5,561,577 | 10/1996 | Motley | 361/56 |
| 5,629,545 | 5/1997 | Leach | 257/362 |

FOREIGN PATENT DOCUMENTS

| | | | |
|---|---|---|---|
| 07086510 | 3/1995 | Japan | H01L 27/04 |

OTHER PUBLICATIONS

Nikkei Microdevice, Nov. 1991, pp. 79–83.

*Primary Examiner*—Mahshid D. Saadat
*Assistant Examiner*—Allan R. Wilson
*Attorney, Agent, or Firm*—Hayes, Soloway, Hennessey, Grossman & Hage, P.C.

[57] ABSTRACT

A semiconductor device has a semiconductor chip which is divided into a plurality of separate regions. In each of these regions, there are provided a plurality of common discharge lines which are independent from one another, a plurality of first bonding pads which are connected directly to the respective common discharge lines, a plurality of second bonding pads which are not connected directly to the common discharge lines, a plurality of protective elements which are connected between the second bonding pads and the common discharge lines, and an inner lead for discharging which is directly connected to the first bonding pads and is bonded to a surface of the semiconductor chip. In all embodiments of the invention, More than one common discharge line is provided. This arrangement permits the reduction of the chip area thus enhancing design freedom and improving electrostatic breakdown characteristics.

7 Claims, 7 Drawing Sheets

SEMICONDUCTOR DEVICE EQUIPPED WITH ELECTROSTATIC BREAKDOWN PROTECTION CIRCUIT

This is a continuation of application Ser. No. 08/680,291 filed on Jul. 12, 1996, now abandoned.

BACKGROUND OF THE INVENTION (1) Field of the Invention

The present invention relates to a semiconductor device, and more particularly to a semiconductor device assembled by using a LOC (Lead on Chip) structure equipped with an electrostatic breakdown protection circuit.

(2) Description of the Related Art

When a high voltage caused by static electricity is applied to a semiconductor device from the outside, the elements on a semiconductor substrate are damaged. In order to prevent this, various electrostatic breakdown protection techniques have been proposed. As one of such techniques, Japanese Patent Application Kokai Publication No. Hei 7-086510 discloses a semiconductor device which is equipped with a common discharge line.

A prior art example (first example) of the semiconductor device disclosed in the above publication is shown in FIG. 1.

The prior art semiconductor device referred to above is constituted by an internal circuit 16, a bonding pad 13s, a bonding pad 13t, a bonding pad 14, a bonding pad 13u, a bonding pad 13v, a bonding pad 13w, and protective elements 15s–15w. The internal circuit 16 includes an input resistor R1 which receives an input signal IN at one of its ends, an input stage circuit 161 of a CMOS inverter type which receives a signal from the other end of the input resistor R1, an internal processing section 162 which carries out predetermined processing of a signal from the input stage circuit 161, and an output stage circuit 163 of a CMOS inverter type which outputs, as an output signal OUT, the signal processed at the internal processing section 162. The bonding pad 13s is connected to a terminal (not shown; no terminals are shown hereinafter) for supplying a power source potential Vcc1 to the input stage circuit 161 and the internal processing section 162. The bonding pad 13t is connected to a terminal for the input signal IN and transmits the input signal IN to one end of the input resistor R1. The bonding pad 14 for grounding is connected to a terminal for supplying the ground potential GND1 and supplies the ground potential GND1 to the input stage circuit 161 and the internal processing section 162. The bonding pad 13u is connected to a terminal for supplying power source potential Vcc2 and supplies the power source potential Vcc2 to the output stage circuit 163. The bonding pad 13v is connected to a terminal for the output signal OUT and outputs the output signal OUT from the output stage circuit 163. The bonding pad 13w is connected to a terminal for the ground potential GND2 and outputs the ground potential GND2 to the output stage circuit 163. The common discharge line 12x is connected to the bonding pad 14 and is provided in the vicinity of the bonding pads 13s –13w. Each of the protective elements 15s–15w is provided with one each of the voltage clamp elements (Q1–Q5) and one each of diode elements (D1–D5) and disposed between the bonding pads 13s–13w and the common discharge line.

Here, the power source potential Vcc2 and the ground potential GND2 supplied to the output stage circuit 163 are separated from the power source potential Vcc1 and the ground potential GND1 supplied to the other circuits. This is because, when a large current flows momentarily during the operation of the output stage circuit 163, the potential changes caused thereby in the power source potential line and the ground potential line may be prevented from affecting the circuits other than the output stage circuit 163 as noise.

By utilizing the above arrangment, when a high voltage of a given polarity is applied between certain bonding pads, the electric discharge flows from one voltage clamp element and one forward direction diode element at the most, resulting in stable electrostatic breakdown characteristics. For example, when a voltage so high as to render the bonding pad 13s to be a positive polarity is applied between the bonding pads 13s and 13w, the discharge of current to the outside from the terminal connected to the bonding pad 13w follows the path from the bonding pad 13s to the voltage clamp element Q1, then to the common discharge line 12x and to the diode element D5.

Since the discharge path is as above, the maximum voltage applied to the internal circuit 16 is the sum of the clamp voltage of the voltage clamp elements (Q1–Q5), the forward direction voltage of the diode elements (D1D5), that is, the so-called "built-in-potential" and the voltage generated by the impedance of the common discharge line 12x. When this maximum voltage is compared with the insulation breakdown voltage of the gate oxide film of the MOS transistor constituting the internal circuit 16, it is appreciated that the design used is such that the protective elements 15s–15w and the common discharge line 12x allow the voltage to be sufficiently low.

FIGS. 2A and 2B are respectively a plan view and a sectional view showing one protective element (15s) formed on a substrate of the semiconductor device and its periphral portions. In FIGS. 2A and 2B, the voltage clamp element (Q1) and the diode element (D1) are formed by N-type impurity regions 171 and 172 and the P-type impurity region 173.

Here, the N-type impurity region 171 is connected to the bonding pad 13s through the contact hole 174 and the metal interconnect 18, and similarly the N-type impurity region 172 and the P-type impurity region 173 are connected to the common discharge line 12x.

Also, the voltage clamp element Q1 is formed by a lateral type NPN bipolar transistor composed of the N-type impurity regions 171 and 172 and the P-type semiconductor substrate 10x, and the diode element D1 is formed by the N-type impurity region 171 and the P-type impurity region 173. In FIG. 2B, the metal interconnect connected to the bonding pads and the common discharge line is not shown.

With the voltage clamp element Q1 constituted by the NPN bipolar transistor described above, it is possible to control the clamp voltage by varying a distance between the two N-type impurity regions 171 and 172. That is, it is possible to set the clamp voltage lower as the distance between the N-type impurity regions 171 and 172 becomes smaller. Thus, although the thickness of the gate oxide film of the MOS transistor is continually being reduced nowadays with the advancement in the miniaturization of the element structure resulting in lowering of insulation breakdown voltage, it is possible to enhance the electrostatic breakdown voltage characteristics in the semiconductor device by lowering the clamp voltage of the voltage clamp element used therein.

FIG. 3 is a plan view of a chip of the semiconductor device to which the electrostatic breakdown protective technique using the common discharge line as described above is applied.

As shown in FIG. 3, the common discharge line 12x is provided at the periphery (scribe line portion) of the semiconductor chip 10x. Generally, in the semiconductor device, such a line that is connected to the semiconductor substrate (hereinafter referred to as a "scribe line") is provided at the periphery of the semiconductor chip. The common discharge line 12x shown in FIG. 3 is in common with the scribe line. Where the common discharge line is in common with the existing scribe line as described above, it is possible to enhance the electrostatic breakdown characteristics without increasing the area of the semiconductor chip. In FIG. 3, no details of the protective elements 15s –15z are shown.

FIG. 4 is a plan view showing an example (second example) in which the die pad for a conducting portion which holds fixed the semiconductor chip is also used as the common discharge line. In FIG. 4, the common discharge line 12y is connected to the die pad 24 by the bonding wire 30 at both ends of the semiconductor chip 10y.

The above explanation has been made for an example wherein the ground potential line is utilized as the common discharge line, but it is of course possible to form arrangements wherein lines other than the ground potential line are used for this purpose.

In recent years, particularly in the area of semiconductor memory devices, increase in memory capacity necessitates an increase in the area of the semiconductor chip. In order to accommodate such a semiconductor chip in a package of standardized dimensions, a new assembling technique called "LOC"(Lead on Chip) has been developed (reference is made, for example, to Nikkei Microdevice, issue of Nov. 1991, pages 79–83).

Whereas, in the conventional lead frame, the die pad which holds fixed the semiconductor chip and the inner lead which is led out as an external terminal for an output signal of the semiconductor device are provided independently from each other (FIG. 4), the new technique referred to above employs an arrangement wherein the inner lead is disposed on the semiconductor chip (thus, being LOC "Lead on Chip") thus fulfilling the function of fixing and holding the semiconductor chip and rendering the die pad unnecessary.

The new technique explained above enables the elimination of the region for separating the die pad and the inner lead from each other and the region otherwise necessary for making bonding on the inner lead. In FIG. 4, the region (B) and the region (C) shown therein correspond respectively to such regions. The magnitude of such regions, covering both the regions (B) and (C), is on the order of 0.5–1 mm, and this means th at a semiconductor chip larger by this magnitude can be accommodated in the package having the same dimensions as those in the prior art.

Further, since the shape of the inner lead on the semiconductor chip can be freely designed, the bonding pad which has previously been provided only at the peripheral portion of the semiconductor chip may be positioned at any location within the surface of the semiconductor chip. This contributes not only to an increase in the design freedom but also to the improvement of semiconductor device characteristics such as an increase in the operation speed because of the shortening of the length of wiring formed on the semiconductor chip and a decrease in noise during operation because of strengthening of power supply wiring.

FIG. 5 is a plan view showing a semiconductor device (third example) having the LOC structure already explained. In FIG. 5, the inner leads 21s–21z are provided on the semiconductor chip 10z, and holds fixed the semiconductor chip 10z by using a bonding agent (not shown). The bonding pads 13s–13z and 14 include, in addition to ones provided on an outer peripheral portion of the semiconductor chip 10z, those (13t, 13x, 13y, 13u) provided in an inner side region of the semiconductor chip. The common discharge line 12z extends to a region near these bonding pads 13t, 13x, 13y and 13u.

However, in the semiconductor device having the LOC structure described above, there have arisen new problems as explained below.

As a result of employing the LOC structure, it is permitted to have the bonding pads located at any desired positions on the surface of the semiconductor chip. However, since the common discharge line is also provided near these bonding pads, it is required to dispose the common discharge line inside the semiconductor chip. That is, the inside of the semiconductor chip requires a region for positioning the common discharge line, and this necessitates an increase in the semiconductor chip area. The width of the common discharge line required is, although it depends on the length thereof, generally on the order of 10 μm to 40 μm, and this results in a corresponding increase in the semiconductor chip area.

One way to prevent such an increase in the semiconductor chip area is to reduce the width of the common discharge line, but a narrowed common discharge line results in an increase in the impedance, thus requiring a higher voltage to be applied to the internal circuit. As a result, the electrostatic breakdown characteristics of the internal circuit deteriorate and various problems develop caused by electrostatic breakdown.

Further, where the bonding pads are disposed both at the periphery and the inside portion of the chip, it is necessary that each of these bonding pads be provided through a protective element or that these bonding pads be provided with a common discharge line with which they are directly interconnected. Moreover, in order to ensure that the impedance of the common discharge line does not become excessively large between any given two bonding pads on the chip surface, it is necessary to make a careful selection of the location of the common discharge line. This means that design freedom is considerably hindered. In the case of the semiconductor memory device, especially, in a DRAM or an SRAM, in which there exists a region with a large number of memory arrays, such a region must be avoided when positioning the common discharge line, and this presents additional difficulties in design.

SUMMARY OF THE INVENTION

An object of the present invention, therefore, is to overcome the problems existing in the prior art, and to provide a semiconductor device in which chip area can be reduced, design freedom can be increased, and electrostatic break down characteristics can be improved.

According to one aspect of the invention, there is provided a semiconductor device with a semiconductor chip having an internal circuit for outputting a predetermined signal after having been processed in response to an input signal, the semiconductor device comprising:

- a plurality of separate regions which are formed by dividing the semiconductor chip;
- common discharge lines which are provided respectively in the separate regions with the common discharge lines being independent from one another;
- first bonding pads which are connected directly to the common discharge lines, respectively;

second bonding pads which are other than those connected directly to the common discharge lines;

protective elements which are connected between the second bonding pads and the common discharge lines; and an inner lead for discharging which is directly connected to the first bonding pads and is bonded to a surface of the semiconductor chip.

The separate regions may be constituted by an overall peripheral region of the semiconductor chip and a predetermined region inside the overall peripheral region, or may be constituted by predetermined peripheral regions of the semiconductor chip.

Also, the common discharge lines may have predetermined portions disposed between the first bonding pads and the protective elements, the predetermined portions directly interconnecting the first bonding pads and the protective elements.

Further, the inner lead may be arranged such that it is provided close to and in parallel with predetermined portions of the common discharge lines with the inner lead being connected to the predetermined portions at a plurality of points.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the drawings.

Figure 6:
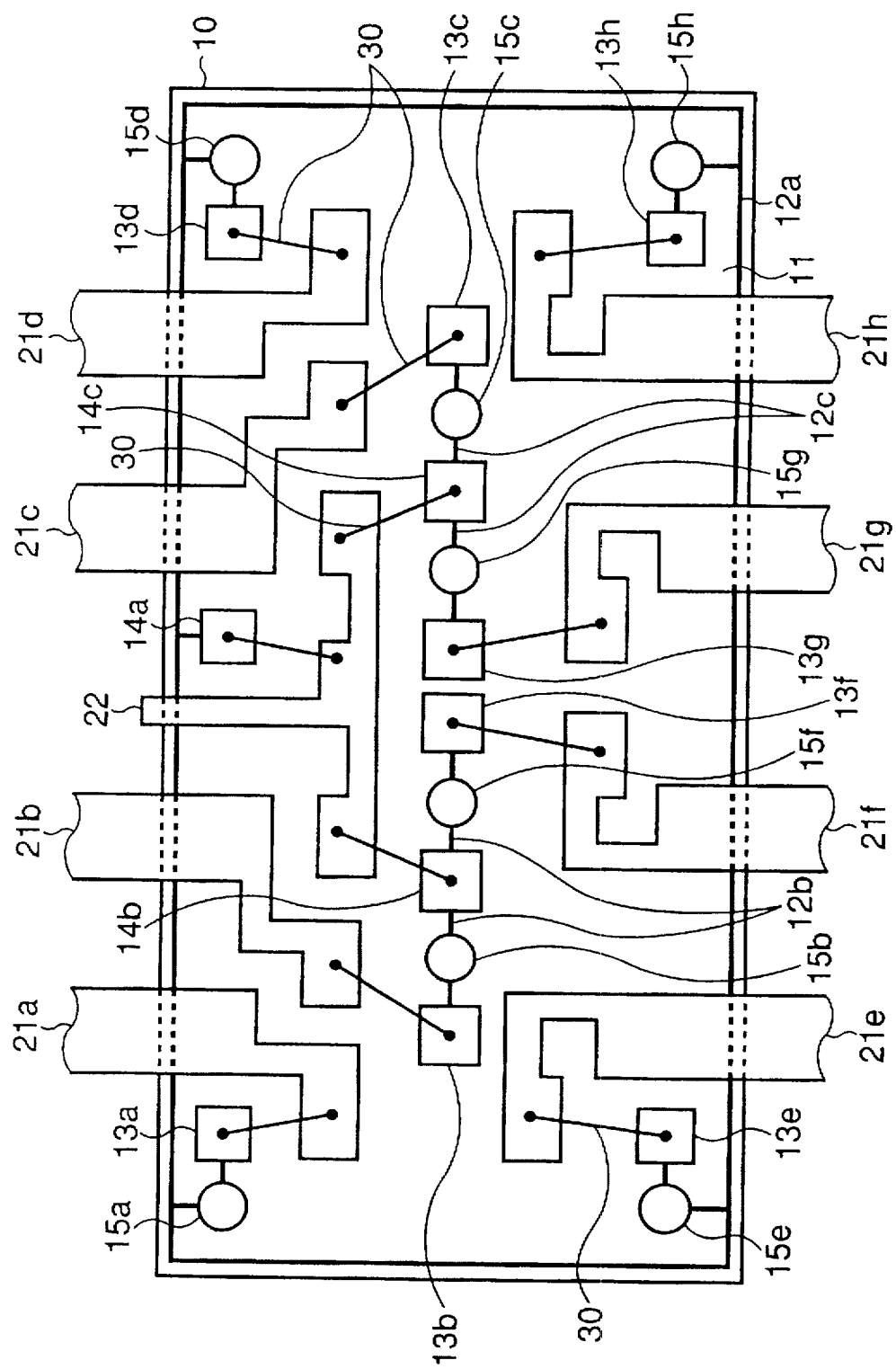
FIG. 6 is a plan view of a first embodiment of a semiconductor device according to the invention.

FIG. 6 shows in a plan view a semiconductor device of a first embodiment according to the invention.

Figure 1:
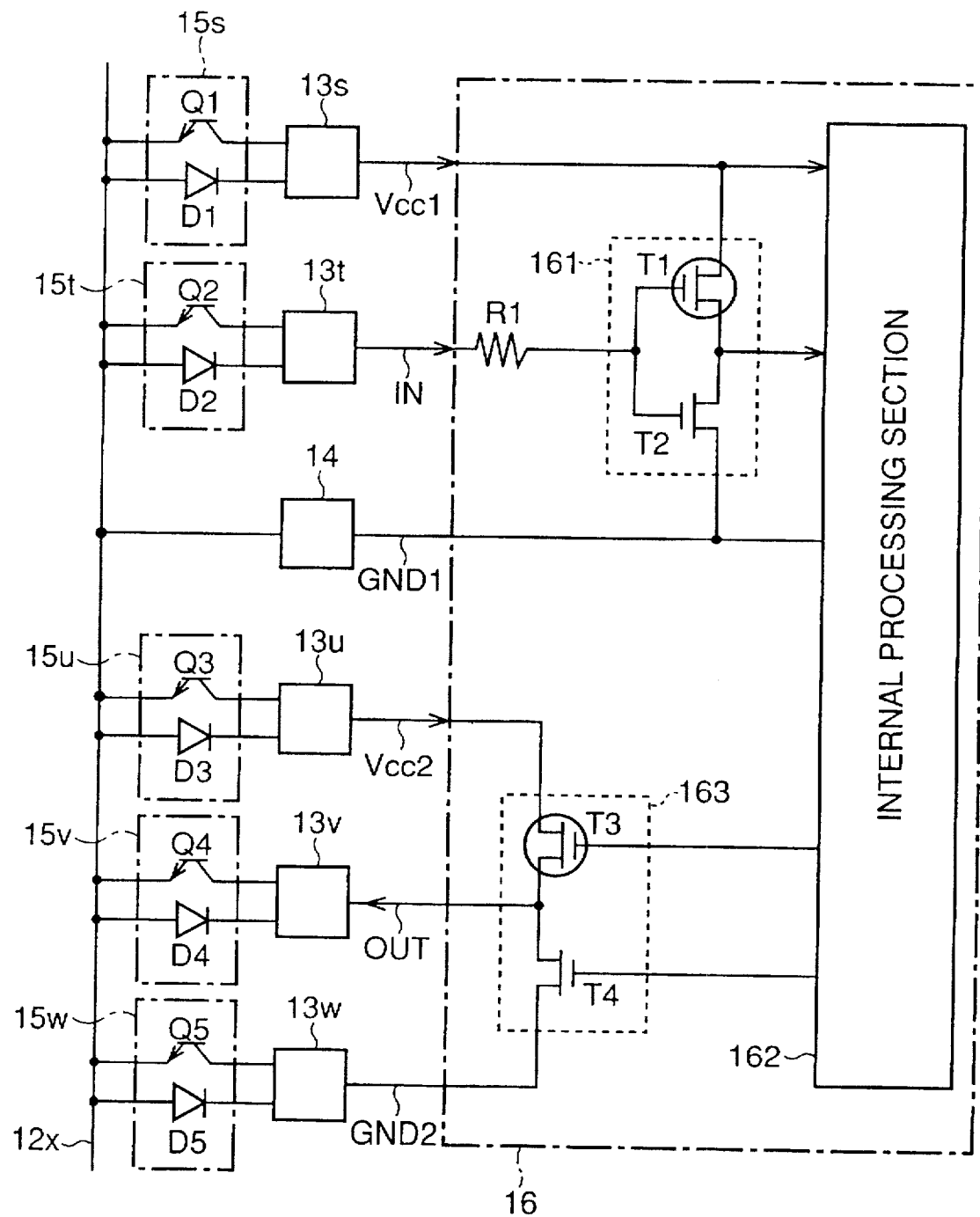
FIG. 1 is a circuit diagram of a first example of a conventional semiconductor device.
Figure 2A:
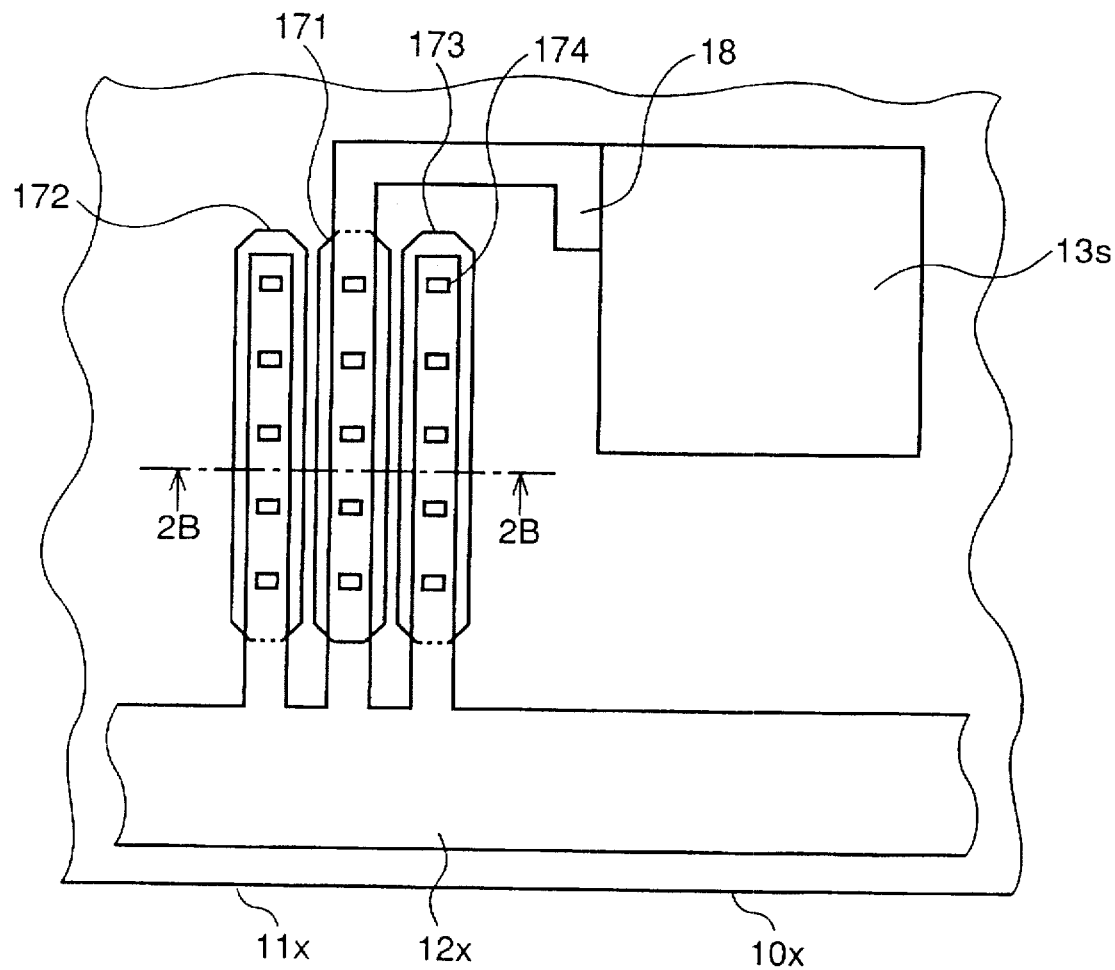
FIG. 2A is a plan view of protective elements and their peripheral portions of the conventional semiconductor device shown in FIG. 1.
Figure 2B:
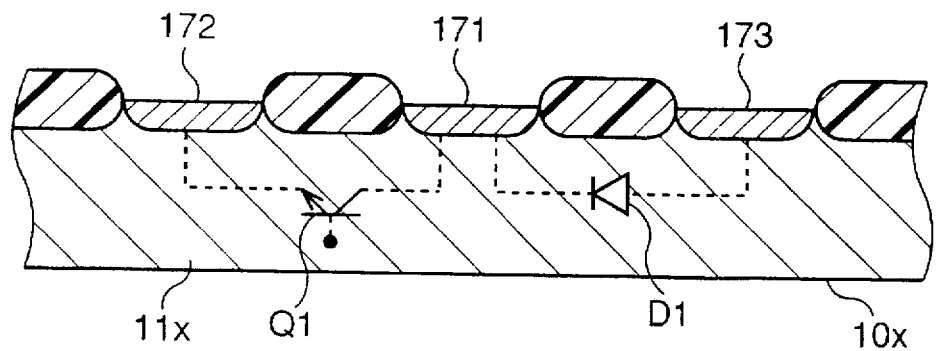
FIG. 2B is a sectional view taken along line 2B—2B of the view shown in FIG. 2A.
Figure 3:
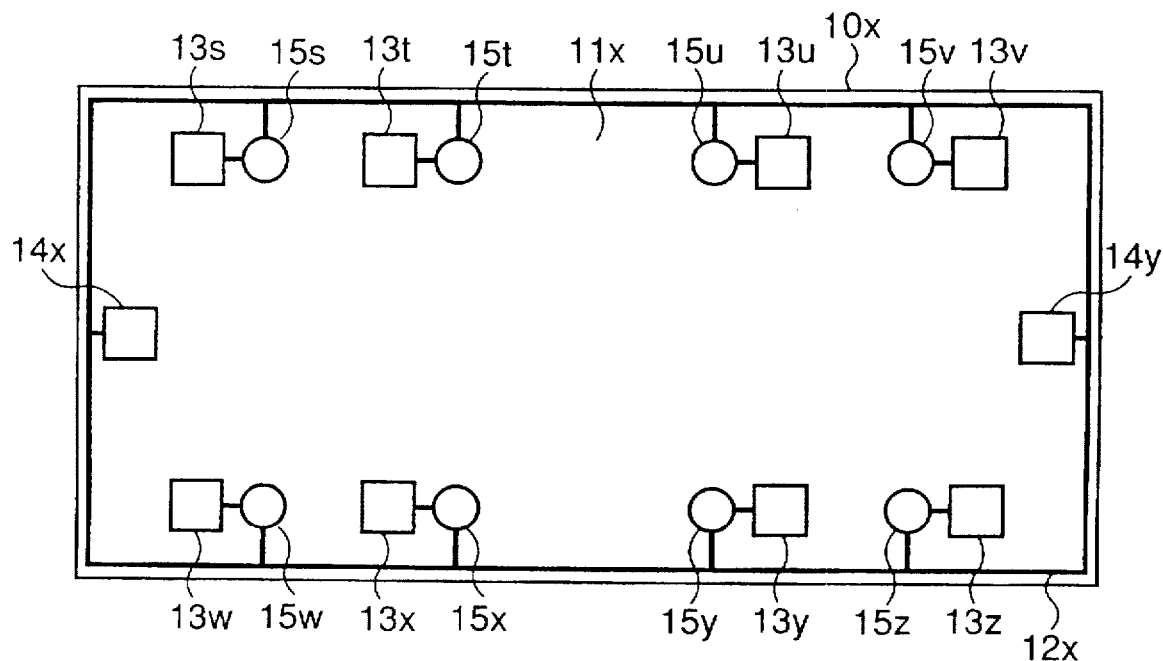
FIG. 3 is a plan view of the first example of the conventional semiconductor device.
Figure 4:
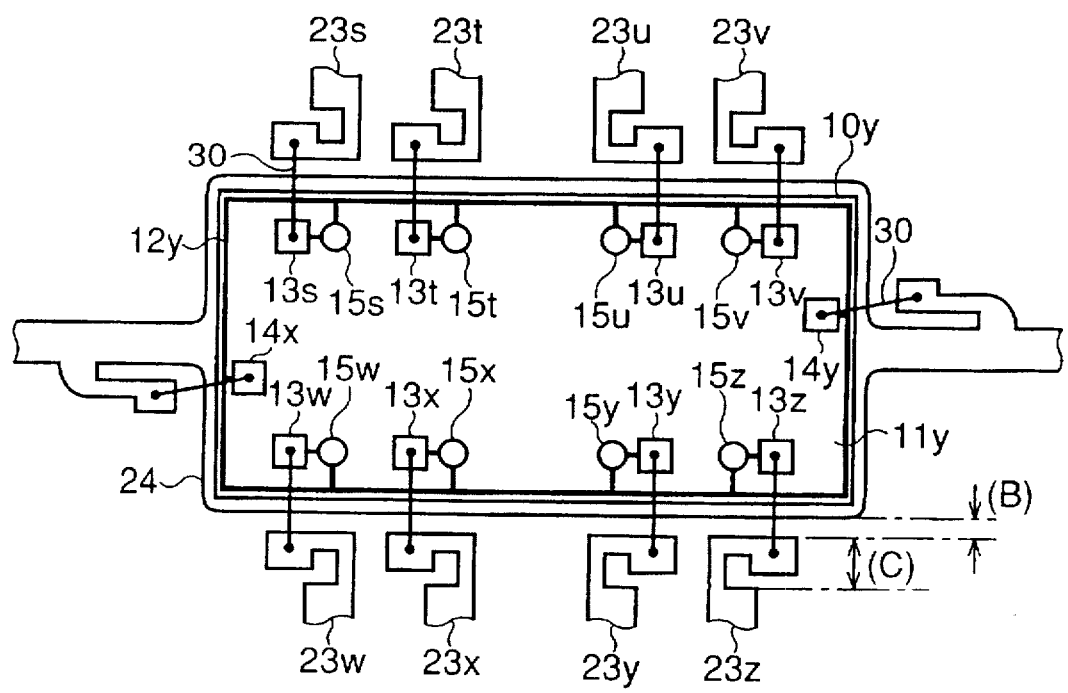
FIG. 4 is a plan view of a second example of the conventional semiconductor device.
Figure 5:
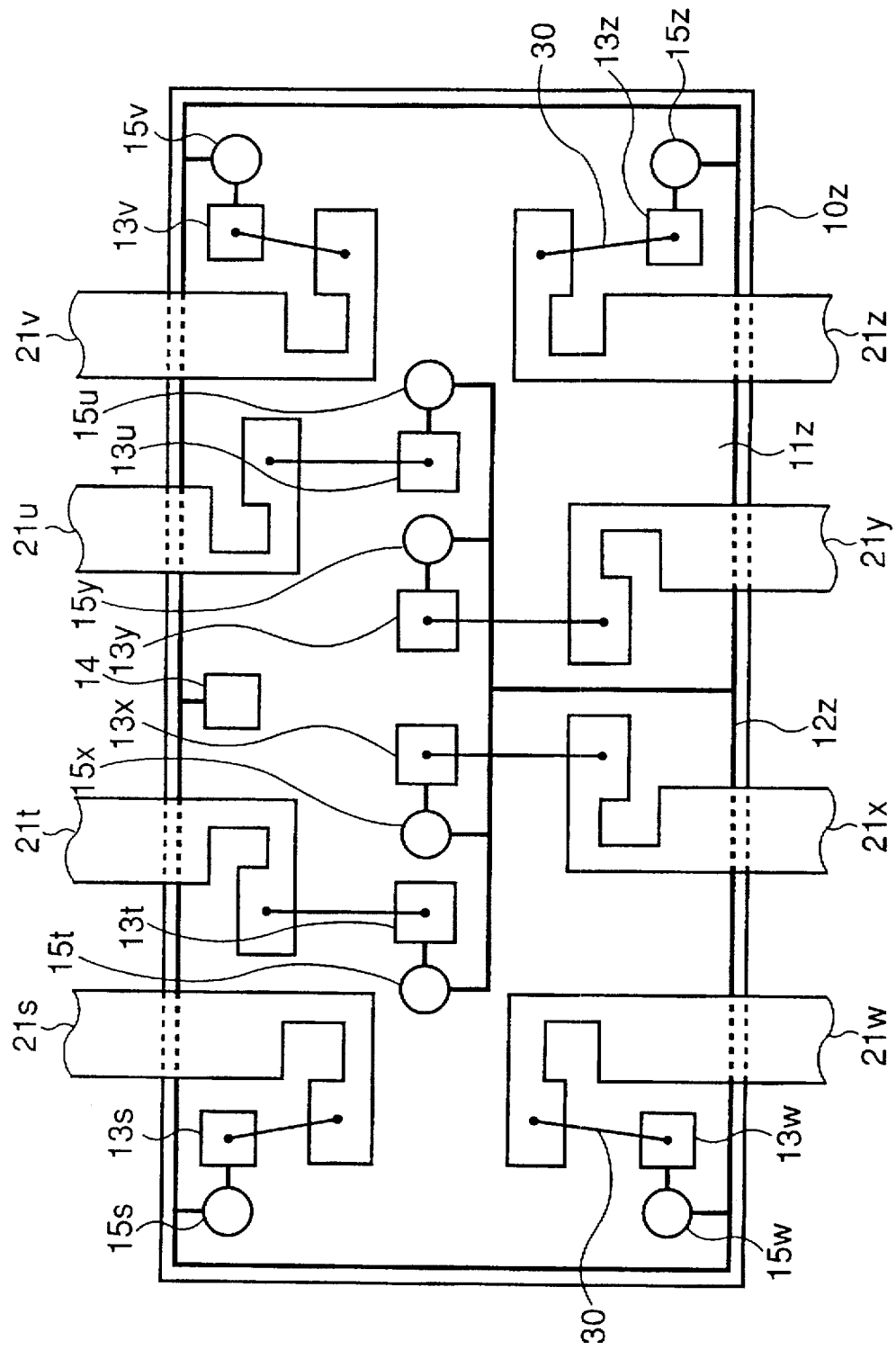
FIG. 5 is a plan view of a third example of the conventional semiconductor device.

The arrangements in this first embodiment are different from those of the prior art semiconductor device shown in FIG. 5 in the following points. In the prior art, all of the protective elements 15s–15z are connected to a single common discharge line 12z. However, in the arrangements in this embodiment, the region of the semiconductor chip 10 provided with the common discharge lines, the bonding pads and the protective elements is divided into three regions, namely, an entire peripheral region and two inside regions surrounded by the peripheral region and, in each of these three regions, the common discharge lines 12a –12c which are independent from each other and the bonding pads 14a–14c which are directly connected to the respective common discharge lines are provided. The protective elements 15a, 15d, 15e, 15h which are disposed at the entire peripheral region are connected to the common discharge line 12a, the protective elements 15b and 15f which are disposed at one of the two inside regions are connected to the common discharge line 12b, and the protective elements 15c and 15g which are disposed at the other of the two inside regions are connected to the common discharge line 12c. The inner lead 22 for the discharging is disposed in the vicinity of the bonding pads 14a–14c and fixed on the surface of the semiconductor chip 10, with the inner lead 22 being connected to these bonding pads 14a 14c by bonding lines 30. The common discharge line 12b is provided between the bonding pad 14b and the protective element 15b and between the bonding pad 14b and the protective element 15f, and interconnects them directly. The common discharge line 12c is provided between the bonding pad 14c and the protective element 15c and between the bonding pad 14c and the protective element 15g, and interonnects them directly. In this first embodiment, although the bonding pads 14b and 14c are additionally provided in the inside regions, there is sufficient room for these bonding pads 14b and 14c to be added if the spaces between the bonding pads 13b, 13f, 13g and 13c (connected to inner leads 21b, 21f, 21g and 21c, respectively) and the protective elements 15b, 15f, 15g and 15c are utilized. As shown in by the corresponding signs of FIG. 5, bonding pads 13a, 13d, 13e and 13h are connected to inner leads 21a, 21d, 21e and 21h, respectively.

Further, according to this embodiment, the common discharge lines 12b, 12c are provided between the bonding pads 14b, 14c and the protective elements 15b, 15f, 15c, 15g so that it is unnecessary to provide the common discharge line to be in parallel with the bonding pads and the protective elements provided at the inside region. Thus, the chip area can be reduced accordingly. Assuming that the width of the common discharge line to be provided in parallel is 30 μm, the chip area can be reduced by about 0.4% in the case of a 16 M bits DRAM. Further, in practice, since the common discharge line interconnecting the peripheral region and the inside region becomes unnecessary, not only can the chip area be reduced accordingly but also other wiring or interconnects otherwise necessary can be omitted, thereby increasing design freedom. Also, since the width of the common discharge line does not have to be reduced, the impedance thereof can be lowered by the inner lead 22 for discharging, thus enabling improvement in electrostatic breakdown characteristics.

Figure 7:
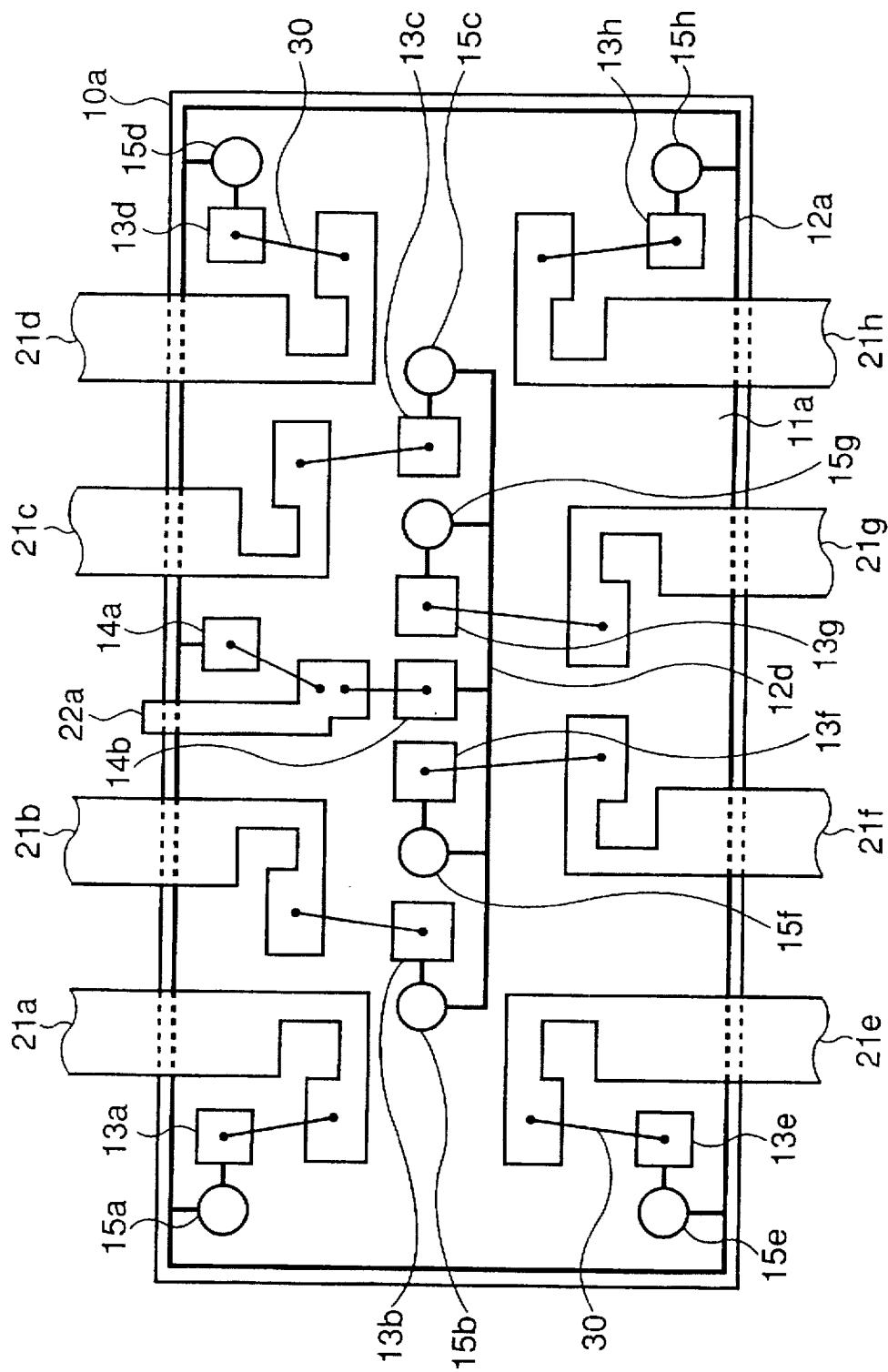
FIG. 7 is a plan view of a second embodiment of the semiconductor device according to the invention.

FIG. 7 is a plan view showing a semiconductor device of a second embodiment according to the invention.

In this second embodiment, in the case where the space is insufficient for the two additional bonding pads to be added, unlike in the first embodiment, only one bonding pad 14b is provided. In this case, the inside region is not divided into two, and there is provided one common discharge line 12d which is directly connected to the bonding pad 14b and located close to and in parallel with the bonding pads 13b, 13f, 14b, 13g, 13c and the protective elements 15b, 15f, 15g, 15c, and these protective elements are interconnected. As in the previous embodiment, bonding pads 13b, 13f, 13g, and 13c are connected to inner leads 21b, 21f, 21g and 21c, respectively. The common discharge lines 12a and 12dare fixed onto the surface of the semiconductor chip 10a, and are interconnected by an inner lead 22a which is connected to the bonding pads 14a and 14b by bonding wires 30. Of course, as shown in the previous embodiment of FIG. 6, bonding pads 13a, 13d, 13e and 13h are connected to inner leads 21a, 21d, 21e and 21h, respectively.

In this second embodiment, although there is no reduction in the chip area in the inside region, the common discharge line to interconnect the common discharge lines 12a and 12d becomes unnecessary so that overall chip area can be reduced accordingly and design freedom can be increased. Further, as in the first embodiment, electrostatic breakdown characteristics can also be improved.

Figure 8:
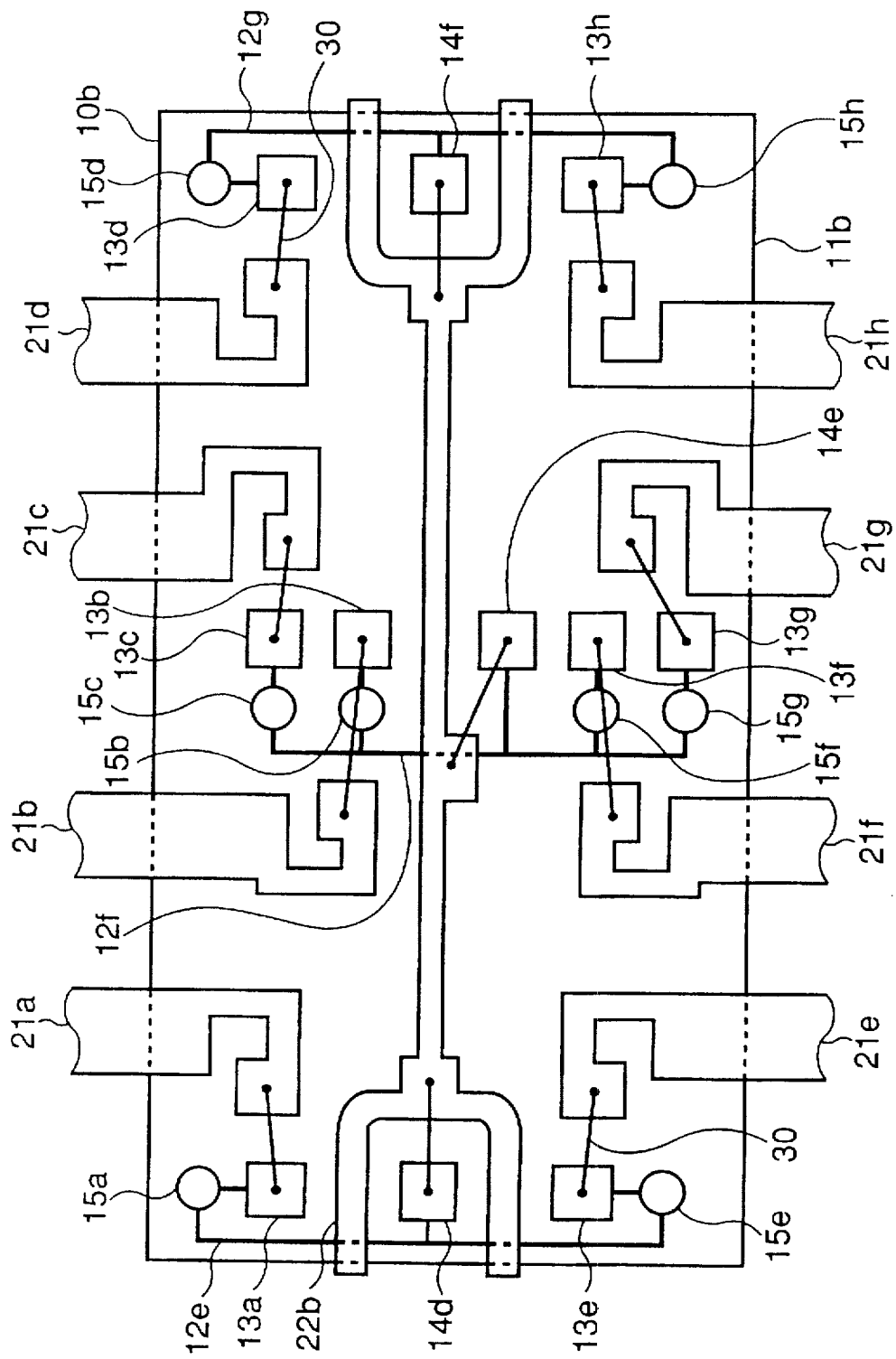
FIG. 8 is a plan view of a third embodiment of the semiconductor device according to the invention.

FIG. 8 is a plan view showing a semiconductor device a third embodiment according to the invention.

In this third embodiment, there are two peripheral regions which are opposed with each other and one inside region. One of the two peripheral regions is provided with a common discharge line 12e, a bonding pad 14d which is directly connected to the common discharge line 12e, and bonding pads 13a, 13e and protective elements 15a, 15e which are located close to and in parallel with the common discharge line 12e. The other of the two peripheral regions is provided with another common discharge line 12g, a bonding pad 14f which is directly connected to the common discharge line 12g, and bonding pads 13d, 13h and protective elements 15d, 15h which are located close to and in parallel with the common discharge line 12g. The inside region is provided with a common discharge line 12f, a bonding pad 14e which is directly connected to the common discharge line 12f, and bonding pads 13b, 13c, 13f, 13g and protective elements 15b, 15c, 15f, 15g which are located close to and in parallel with the common discharge line 12f. The common discharge lines 12e, 12f, 12g are connected respectively to the bonding pads 14d, 14e, 14f by bonding wires 30 and are interconnected by an inner lead 22b fixed on the surface of the semiconductor chip 10b. Of course, bonding pads 13a–13h are connected to inner leads 21a–21h, respectively.

In this third embodiment, no common discharge lines are necessary for the sides other than those at which the common discharge lines 12e, 12g are provided, and no common discharge line is required either for connecting the peripheral regions and the inside region. The chip area can be reduced accordingly and design freedom can be increased. Also, as in the first and second embodiments, electrostatic breakdown characteristics are improved.

For describing the above embodiments, examples have been used wherein the common discharge lines are separately provided respectively to a plurality of regions with these common discharge lines being interconnected by the inner lead or leads, but the invention is not limited such examples. For example, where any common discharge line cannot be made sufficiently wide thus causing an increase in the impedance, the inner lead for the discharging may be provided close to and in parallel with the common discharge line and may be connected to the common discharge line at a plurality of points and, in this way, it is possible to lower the impedance.

As explained above, according to the invention, the semiconductor device is configured such that the region of the semiconductor chip at which the bonding pads, the protective elements and the common discharge lines are provided is divided into a plurality of separate regions and, in these separate regions, there are provided the common discharge lines which are independent from one another and a plurality of bonding pads which include those bonding pads that are directly connected to the common discharge lines as well as the protective elements, and the inner lead for discharging which is connected to each of the common discharge lines respectively in the separate regions and is bonded onto the surface of the semiconductor chip. Thus, when compared with the prior art example in which there is only a single common discharge line, the portion of the common discharge line that is used for connecting the peripheral portion to the inside portion can be replaced by the inner lead for discharging, and this means that the area occupied by the common discharge line is reduced accordingly and design freedom is increased. Also, the impedance of the common discharge lines including the common discharge line for discharging is lowered resulting in improvement of electrostatic breakdown characteristics.

While the invention has been described with reference to its preferred embodiments, it is to be understood that the words which have been used are words of description rather than limitation and that changes within the purview of the appended claims may be made without departing from the true scope of the invention as defined by the claims.

What is claimed is:

1. A semiconductor device with a semiconductor chip having an internal circuit for outputting a predetermined signal after having been processed in response to an input signal, said semiconductor device comprising:

first and second separate regions which are formed by dividing said semiconductor chip;

first and second common discharge lines, said first common discharge line being provided only in said first separate region and said second common discharge line being provided only in said second separate region, said common discharge lines being independent from one another;

a plurality of bonding pads including at least one first bonding pad which is connected directly to said first common discharge line;

at least one second bonding pad which is connected directly to said second common discharge line;

first protective elements which are connected between bonding pads other than said first and second bonding pads and said first common discharge line;

second protective elements which are connected between other bonding pads other than said first and second bonding pads, and said second common discharge line;

an inner lead for discharging which is directly connected to said first and second bonding pads and is bonded to a surface of said semiconductor chip, said inner lead also being for holding the semiconductor chip in a lead-on-chip arrangement; and bonding wires for bonding said inner lead and said first and second bonding pads.

2. A semiconductor device according to claim 1, in which said first and second separate regions are constituted by an overall peripheral region of said semiconductor chip, and a predetermined region inside said overall peripheral region, respectively.

3. A semiconductor device according to claim 1, in which said first and second separate regions are constituted by predetermined peripheral regions of said semiconductor chip, and predetermined inside regions of said semiconductor chip respectively.

4. A semiconductor device according to claim 1, wherein said first separate region comprises said first bonding pad and said second separate region comprises said second bonding pad, in said first separate region only said first bonding pad is connected directly to said inner lead by using said bonding wires, and in said second separate region only said second bonding pad is connected directly to said inner lead by using said bonding wires.

5. A semiconductor device according to claim 1, wherein said inner lead extends across substantially an entire surface of said semiconductor chip.

6. A semiconductor device according to claim 1, wherein said inner lead extends adjacent and parallel to at least one of said discharge lines, said inner lead also extending from one of said separate regions toward another of said separate regions.

7. A semiconductor device according to claim 6 wherein said at least one of said discharge lines is connected at a plurality of points to said inner lead.

* * * * *